(12) United States Patent
Wu et al.

(10) Patent No.: US 9,041,064 B2
(45) Date of Patent: May 26, 2015

(54) HIGH VOLTAGE GAN TRANSISTOR

(75) Inventors: Yifeng Wu, Goleta, CA (US); Primit Parikh, Goleta, CA (US); Umesh Mishra, Montecito, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 13/445,632

(22) Filed: Apr. 12, 2012

(65) Prior Publication Data

US 2012/0223366 A1    Sep. 6, 2012

Related U.S. Application Data

(63) Continuation of application No. 13/014,619, filed on Jan. 26, 2011, now Pat. No. 8,169,005, which is a continuation of application No. 12/636,019, filed on Dec. 11, 2009, now Pat. No. 7,893,500, which is a continuation of application No. 11/603,427, filed on Nov. 21, 2006, now Pat. No. 7,692,263.

(51) Int. Cl.
*H01L 29/66* (2006.01)
*H01L 29/778* (2006.01)
(Continued)

(52) U.S. Cl.
CPC ......... *H01L 29/7786* (2013.01); *H01L 29/2003* (2013.01); *H01L 29/404* (2013.01); *H01L 29/66462* (2013.01)

(58) Field of Classification Search
CPC ............ H01L 29/2003; H01L 29/7787; H01L 29/6642; H01L 29/404; H01L 29/402
USPC .......... 257/192, 194, 367, E29.009, E29.246, 257/E29.247, E29.248, E29.252, E21.403, 257/409, 469, 483, 487, 283, E21.178, 282
See application file for complete search history.

(56) References Cited

U.S. PATENT DOCUMENTS 4,551,905 A    11/1985    Chao et al. ...................... 29/571
4,946,547 A    8/1990    Palmour et al. ............... 156/643
(Continued)

FOREIGN PATENT DOCUMENTS

DE    3323347    10/1985
DE    3823347 A1    1/1990
(Continued)

OTHER PUBLICATIONS

Examiner's Report from Canadian Patent Appl. No. 2,447,058, dated Dec. 5, 2012.
(Continued)

*Primary Examiner* — Cuong Q Nguyen
*Assistant Examiner* — Yosef Gebreyesus
(74) *Attorney, Agent, or Firm* — Koppel, Patrick, Heybl & Philpott

(57) ABSTRACT

A multiple field plate transistor includes an active region, with a source, drain, and gate. A first spacer layer is between the source and the gate and a second spacer layer between the drain and the gate. A first field plate on the first spacer layer and a second field plate on the second spacer layer are connected to the gate. A third field plate connected to the source is on a third spacer layer, which is on the gate and the first and second field plates and spacer layers. The transistor exhibits a blocking voltage of at least 600 Volts while supporting current of at least 2 or 3 Amps with on resistance of no more than 5.0 or 5.3 m$\Omega$-cm$^2$, respectively, and at least 900 Volts while supporting current of at least 2 or 3 Amps with on resistance of no more than 6.6 or 7.0 m$\Omega$-cm$^2$, respectively.

21 Claims, 3 Drawing Sheets

(51) Int. Cl.
*H01L 29/40* (2006.01)
*H01L 29/20* (2006.01)

(56) References Cited

U.S. PATENT DOCUMENTS

| | | | |
|---|---|---|---|
| 4,947,232 A | 8/1990 | Ashida et al. | 357/53 |
| 5,192,987 A | 3/1993 | Khan et al. | |
| 5,196,359 A | 3/1993 | Shih et al. | 437/40 |
| 5,200,022 A | 4/1993 | Kong et al. | 156/612 |
| 5,210,051 A | 5/1993 | Carter, Jr. | |
| 5,252,843 A * | 10/1993 | Suzuki | 257/284 |
| 5,290,393 A | 3/1994 | Nakamura | |
| 5,296,395 A | 3/1994 | Khan et al. | 437/40 |
| 5,298,444 A * | 3/1994 | Ristow | 438/571 |
| RE34,861 E | 2/1995 | Davis et al. | 437/100 |
| 5,393,990 A | 2/1995 | Kohn | |
| 5,393,993 A | 2/1995 | Edmond et al. | |
| 5,399,886 A | 3/1995 | Hasegawa | 257/192 |
| 5,462,884 A * | 10/1995 | Taniguchi | 438/286 |
| 5,523,589 A | 6/1996 | Edmond et al. | |
| 5,569,937 A | 10/1996 | Bhatnagar et al. | 257/77 |
| 5,592,501 A | 1/1997 | Edmond et al. | |
| 5,686,738 A | 11/1997 | Moustakas | |
| 5,739,554 A | 4/1998 | Edmond et al. | |
| 5,885,860 A | 3/1999 | Weitzel et al. | 438/179 |
| 5,929,467 A | 7/1999 | Kawai et al. | 257/192 |
| 5,930,656 A | 7/1999 | Furukawa et al. | |
| 6,004,881 A | 12/1999 | Bozada et al. | |
| 6,033,948 A | 3/2000 | Kwon et al. | 438/217 |
| 6,046,464 A | 4/2000 | Schetzina | 257/96 |
| 6,064,082 A | 5/2000 | Kawai et al. | |
| 6,100,571 A | 8/2000 | Mizuta et al. | 257/488 |
| 6,177,685 B1 | 1/2001 | Teraguchi et al. | |
| 6,218,680 B1 | 4/2001 | Carter et al. | |
| 6,236,094 B1 | 5/2001 | Wright | 257/413 |
| 6,307,232 B1 | 10/2001 | Akiyama et al. | 257/347 |
| 6,316,793 B1 | 11/2001 | Sheppard et al. | 257/103 |
| 6,316,820 B1 | 11/2001 | Schmitz et al. | 257/649 |
| 6,346,451 B1 | 2/2002 | Simpson et al. | 438/311 |
| 6,445,038 B1 | 9/2002 | Tihanyi | 257/347 |
| 6,468,878 B1 | 10/2002 | Petruzzello et al. | 438/454 |
| 6,475,857 B1 | 11/2002 | Kim et al. | 438/240 |
| 6,483,135 B1 | 11/2002 | Mizuta et al. | 257/283 |
| 6,486,502 B1 | 11/2002 | Sheppard et al. | 257/194 |
| 6,489,628 B1 | 12/2002 | Morizuka | 257/12 |
| 6,495,409 B1 | 12/2002 | Manfra et al. | 438/216 |
| 6,548,333 B2 | 4/2003 | Smith | |
| 6,559,513 B1 | 5/2003 | Miller et al. | 257/488 |
| 6,586,781 B2 | 7/2003 | Wu et al. | 257/194 |
| 6,690,042 B2 | 2/2004 | Khan et al. | 257/192 |
| 7,355,215 B2 * | 4/2008 | Parikh et al. | 257/194 |
| 7,365,374 B2 | 4/2008 | Piner et al. | 257/189 |
| 7,432,142 B2 | 10/2008 | Saxler et al. | 438/167 |
| 7,638,818 B2 | 12/2009 | Wu et al. | 257/192 |
| 7,692,263 B2 | 4/2010 | Wu et al. | |
| 7,812,369 B2 * | 10/2010 | Chini et al. | 257/192 |
| 2001/0015446 A1 | 8/2001 | Inoue et al. | |
| 2001/0023964 A1 | 9/2001 | Wu et al. | |
| 2002/0005528 A1 | 1/2002 | Nagahara | |
| 2002/0017648 A1 | 2/2002 | Kasahara et al. | |
| 2002/0137318 A1 | 9/2002 | Peake et al. | |
| 2002/0155646 A1 | 10/2002 | Petruzzello et al. | |
| 2002/0167023 A1 | 11/2002 | Chavarkar et al. | |
| 2002/0173062 A1 | 11/2002 | Chen et al. | |
| 2003/0020092 A1 | 1/2003 | Parikh et al. | |
| 2003/0085409 A1 | 5/2003 | Shen et al. | |
| 2003/0102482 A1 | 6/2003 | Saxler | |
| 2003/0107065 A1 | 6/2003 | Taniguchi et al. | |
| 2003/0107081 A1 | 6/2003 | Lee et al. | |
| 2003/0183844 A1 | 10/2003 | Yokoyama et al. | |
| 2003/0222327 A1 | 12/2003 | Yamaguchi et al. | |
| 2004/0012015 A1 | 1/2004 | Saxler | |
| 2004/0061129 A1 | 4/2004 | Saxler et al. | |
| 2004/0159865 A1 | 8/2004 | Allen et al. | |
| 2004/0232510 A1 * | 11/2004 | Petruzzello et al. | 257/491 |
| 2005/0051796 A1 * | 3/2005 | Parikh et al. | 257/192 |
| 2005/0051800 A1 | 3/2005 | Mishra et al. | |
| 2005/0059197 A1 | 3/2005 | Yamashita et al. | |
| 2005/0062069 A1 * | 3/2005 | Saito et al. | 257/213 |
| 2005/0110042 A1 * | 5/2005 | Saito et al. | 257/192 |
| 2005/0133818 A1 * | 6/2005 | Johnson et al. | 257/192 |
| 2005/0173728 A1 | 8/2005 | Saxler | |
| 2005/0189561 A1 | 9/2005 | Kinzer et al. | |
| 2005/0253168 A1 * | 11/2005 | Wu et al. | 257/192 |
| 2005/0258450 A1 | 11/2005 | Saxler | |
| 2005/0258451 A1 | 11/2005 | Saxler et al. | |
| 2006/0019435 A1 | 1/2006 | Sheppard et al. | |
| 2006/0108606 A1 | 5/2006 | Saxler et al. | |
| 2006/0202272 A1 * | 9/2006 | Wu et al. | 257/355 |
| 2006/0289894 A1 | 12/2006 | Murata et al. | |
| 2007/0228415 A1 | 10/2007 | Kanamura et al. | |
| 2007/0235775 A1 * | 10/2007 | Wu et al. | 257/288 |
| 2008/0125867 A1 | 5/2008 | McCleary et al. | 257/40 |

FOREIGN PATENT DOCUMENTS

| | | |
|---|---|---|
| EP | 0069429 A | 1/1983 |
| EP | 0792028 | 8/1997 |
| EP | 1336989 | 8/2003 |
| EP | 1577951 A2 | 3/2005 |
| EP | 1577951 A2 | 9/2005 |
| EP | 1 901 341 | 3/2008 |
| EP | 1 901 342 | 3/2008 |
| EP | 1901341 | 3/2008 |
| EP | 1901342 | 3/2008 |
| GB | 2296373 A | 6/1996 |
| JP | 51-129173 | 11/1976 |
| JP | 53060567 | 5/1978 |
| JP | 55-039636 | 3/1980 |
| JP | 62-136881 | 6/1987 |
| JP | 63188964 | 12/1988 |
| JP | 03066136 | 3/1991 |
| JP | S48086473 | 11/1993 |
| JP | 05326890 | 12/1993 |
| JP | 06124965 | 5/1994 |
| JP | 07-283140 | 10/1995 |
| JP | 7326737 | 12/1995 |
| JP | 08-255898 | 10/1996 |
| JP | 08255898 | 10/1996 |
| JP | 9246527 | 9/1997 |
| JP | 09-307097 | 11/1997 |
| JP | 09-321307 | 12/1997 |
| JP | 10173036 | 6/1998 |
| JP | 10189565 | 7/1998 |
| JP | 10-223901 | 8/1998 |
| JP | 11111968 | 4/1999 |
| JP | 11-261052 | 9/1999 |
| JP | 11261051 | 9/1999 |
| JP | 2000068498 | 3/2000 |
| JP | 2000-174260 | 6/2000 |
| JP | 2000223697 | 8/2000 |
| JP | 2000-252458 | 9/2000 |
| JP | 2000266117 | 9/2000 |
| JP | 2001-007325 | 1/2001 |
| JP | 2001-077415 | 3/2001 |
| JP | 2001085670 | 3/2001 |
| JP | 2001-098369 | 4/2001 |
| JP | 2001251869 | 9/2001 |
| JP | 2002076024 | 3/2002 |
| JP | 05021793 A | 1/2003 |
| JP | 2003100778 | 4/2003 |
| JP | 2003338510 | 11/2003 |
| JP | 2004022773 | 1/2004 |
| JP | 2005-086171 | 3/2005 |
| JP | 2006004976 | 1/2006 |
| JP | 2006135241 | 5/2006 |
| JP | 2006196764 | 7/2006 |
| JP | 2007505501 | 3/2007 |
| WO | WO00/04587 | 1/2000 |
| WO | WO 03032397 | 4/2003 |
| WO | WO 03038905 A2 | 5/2003 |
| WO | WO 2004068590 A1 | 8/2004 |
| WO | WO 2005114743 | 1/2005 |
| WO | WO 2005024909 | 3/2005 |

(56) References Cited

FOREIGN PATENT DOCUMENTS

| WO | WO 2005/114743 A | 12/2005 |
|---|---|---|
| WO | WO 2005114743 | 12/2005 |
| WO | WO 2005114743 A2 | 12/2005 |
| WO | WO 2006/098801 A1 | 9/2006 |
| WO | WO 2006098801 | 9/2006 |
| WO | WO2006132418 | 12/2006 |
| WO | WO 2008027027 A2 | 3/2008 |

OTHER PUBLICATIONS

Notice of Allowance from U.S. Appl. No. 12/636,019, filed Dec. 11, 2009, Dated: Oct. 15, 2010.
Office Action from U.S. Appl. No. 11/904,064, mailed Nov. 19, 2009.
Response to Office Action for U.S. Appl. No. 11/904,064, dated: Feb. 19, 2010.
Office Action for U.S. Appl. No. 11/726,975, mailed Dec. 28, 2009.
Response to Office Action for U.S. Appl. No. 11/726,975, dated: Mar. 29, 2010.
Office Action for U.S. Appl. No. 11/356,791, mailed Apr. 7, 2010.
Response to Office Action for U.S. Appl. No. 11/356,791, dated: May 25, 2010.
Office Action for U.S. Appl. No. 11/904,064, mailed May 19, 2010.
Office Action for U.S. Appl. No. 11/356,791, mailed Jun. 11, 2010.
Office Action for U.S. Appl. No. 11/726,975, mailed on Jun. 23, 2010.
Office Action for U.S. Appl. No. 10/102,272, mailed Mar. 3, 2003.
Response to Office Action for U.S. Appl. No. 10/102,272, filed Jul. 3, 2003.
Office Action for U.S. Appl. No. 10/102,272, mailed May 6, 2004.
Response to Office Action for U.S. Appl. No. 10/102,272, dated: Aug. 6, 2004.
Notice of Allowance for U.S. Appl. No. 10/102,272, dated: Aug. 31, 2004.
Office Action for U.S. Appl. No. 10/201,345, mailed: Mar. 19, 2004.
Response to Office Action for U.S. Appl. No. 10/201,345, dated: Jun. 18, 2004.
Response to Office Action for U.S. Appl. No. 10/201,345, dated: Dec. 8, 2004.
Office Action for U.S. Appl. No. 10/201,345, mailed: Sep. 8, 2004.
Office Action for U.S. Appl. No. 10/201,345, mailed: Mar. 3, 2005.
Notice of Allowance for U.S. Appl. No. 10/201,345, dated: Feb. 26, 2007.
Response to Office Action for U.S. Appl. No. 10/201,345, dated: Jul. 5, 2005.
Office Action for U.S. Appl. No. 10/201,345, mailed: Jul. 20, 2005.
Response to Office Action for U.S. Appl. No. 10/201,345, dated: Aug. 22, 2005.
Office Action for U.S. Appl. No. 10/201,345, mailed: Oct. 5, 2005.
Response to Office Action for U.S. Appl. No. 10/201,345, dated: Mar. 7, 2006.
Office Action for U.S. Appl. No. 10/201,345, mailed: May 26, 2006.
Response to Office Action for U.S. Appl. No. 10/201,345, dated: Nov. 27, 2006.
Response to Office Action for U.S. Appl. No. 10/201,345, dated: Feb. 13, 2007.
Office Action for U.S. Appl. No. 11/603,427, mailed: Feb. 6, 2008.
Office Action for U.S. Appl. No. 11/603,427, mailed: Dec. 10, 2008.
Office Action for U.S. Appl. No. 11/799,786, mailed: Sep. 8, 2008.
Decision to Grant a European Patent, Application No. 08250197.4-1235/1973163, dated Mar. 15, 2012.
Saburo Nagakura, et al, edited Iwanami Physical and Chemical Dictionary, Japan, Iwanami Shoten, Apr. 24, 1998, fifth edition, p. 992, nichrome.
Examination Report from related European Patent Application No. 02769655.8-1235, Dated: Nov. 3, 2008.
Second Office Action from related China Application No. 02818502. 1., Dated: Feb. 19, 2009.
Examination Report from related European Patent Application No. 06851411.6-2203, dated: Jan. 26, 2009.
"Enhancement of Base Conductivity Via the Piezoelectric Effect in AlGaN/GaN HBTs", Asbeck et al., Aug. 18, 1999, Solid State Electronics 44 (2000) 211 219, pp. 211-219.
"New UV Light Emitter based on AlGaN Heterostructures with Graded Electron and Hole Injectors", Johnson et al., XP-002505432, Mat. Res. Soc. Symp. Proc. vol. 743, 2003, Materials Research Society, pp. 1.2.4.1-1.7.4.6.
"Polarization-Induced 3-Dimensional Electron Slabs in Graded AlGaN Layers", Simon et al., XP-002505433, Mater. Res. Soc. Symp. Proc. vol. 892, 2006 Materials Research Society, pp. 1-6.
Examiner's Report from related Canada Patent Application No. 2,399,547, Dated: Mar. 4, 2009.
Response to Office Action U.S. Appl. No. 11/904,064, dated: May 19, 2010, filed Oct. 19, 2010.
Response to Office Action U.S. Appl. No. 11/356,791, dated: Apr. 7, 2010, filed Jul. 2, 2010.
Response to Office Action U.S. Appl. No. 11/726,975, dated: Jun. 23, 2010, filed Nov. 22, 2010.
Office Action from U.S. Appl. No. 11/726,975, dated: Mar. 1, 2011.
Office Action from U.S. Appl. No. 12/581,977, dated: Sep. 16, 2010.
Final Notice of Reasons for Rejection for Japanese Patent Application No. 2009-243336 mailed Apr. 26, 2011.
Notice of Reasons for Rejection for Japanese Patent Application No. 2009-243337 mailed Apr. 26, 2011.
PCT Notification of Transmittal of International Preliminary Examination Report for related PCT Application No. PCT/US06/26405, dated Jan. 20, 2010.
Journal of Applied Physics: "Effect of Polarization Fields on Transport Properties in AlGaN/GaN Heterostructures", Hsu et al., vol. 89, No. 3, Feb. 1, 2001, pp. 1783-1789.
IEEE Electron Device Letters: "AlGaN/GaN Metal Oxide Semiconductor Heterostructure Field Effect Transistor", Khan et al., vol. 21, No. 2 Feb. 2000, pp. 63-65.
Eastman et al. Undoped AlGaN/GaN HEMTs for Microwave Power Amplification, IEEE Transaction on Electron Devices, vol. 48, No. 3, Mar. 2001.
CRC Press, The Electrical Engineering Handbook, Second Edition. Dorf, pp. 994, 1997 "Three-Terminal Active Microwave Devices".
B. Gelmont, et al, "Monte Carlo Simulation of Electron Transport in Gallium Nitride". J. Appl. Phys. 74, 1993, pp. 1818-1821.
R. Gaska et al., "Electron Transport in AlGaN—GaN Heterostructures Grown on 6H-SiC Substrates", Appl. Phys. Lett. 72, No. 6. Feb. 1998, pp. 707-709.
Wu et al., "GaN-Based FETs for Microwave Power Amplification", IEICE Trans. Electron. vol. E82-C, No. 11, Nov. 1999, pp. 1895-1905.
Wu et al., "30-W/mm GaN HEMTs by Field Plate Optimization", IEEE Electron Device Letters, vol. 25, No. 3, Mar. 2004, pp. 117-119.
M. Micovic et al., "AlGaN/GaN Heterojunction Field Effect Transistors Grown by Nitrogen Plasma Assisted Molecular Beam Epitaxy", IEEE Trans. Electron Devices. vol. 48, No. 3, Mar. 2001, pp. 591-596.
Saito W. et al, "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, No. 4B, Apr. 2004, pp. 2239-2242, ISSN: 021-4922.
Official Notice of Rejection from Japanese Patent Application No. 2009-243337 mailed Jun. 8, 2010.
Summary of "Decision of Rejection" for Japanese Patent Application No. 2009-243336 mailed Aug. 30, 2011.
Summary of "Decision to Dismiss the Amendment" for Japanese Patent Application No. 2009-243336 mailed Aug. 30, 2011.
Decision of Final Rejection for Japanese Patent Application No. 2001-557092 dated Sep. 15, 2011.
Summary of "Notice of Reasons for Rejection" for Japanese Patent Application No. 2008-013133 mailed Dec. 6, 2011.
Summary of Reasons for Rejection for counterpart Japanese Patent Application No. 2007-245497 mailed Dec. 6, 2011.
EPO Examination Report for European Patent Application No. 02769655.8 dated Jan. 18, 2012.

(56) References Cited

OTHER PUBLICATIONS

Appeal Filing No. 2011-004802 for Japanese Patent Application No. 2009-243337 dated Jan. 31, 2012, Summary of "Invitation to Submit Applicant's Opinion" and "Summary of Examiner's Report to the Board".
Office Action for Canadian Patent Application No. 2,454,269 dated Aug. 26, 2011.
Summary of Decision of Rejection for Japanese Patent Application No. 2003-535260 mailed Aug. 30, 2011.
Official Notice of Rejection from Japanese Patent Application No. 2009-243336 mailed Jun. 8, 2010.
Final Official Notice of Rejection from Japanese Patent Application No. 2003-535260 mailed Jun. 8, 2010.
Office Action for family related U.S. Appl. No. 11/799,786, dated Sep. 8, 2008.
Office Action for family related U.S. Appl. No. 11/356,791, dated: Sep. 2, 2008.
Extended European Search Report, for related European Application No. 07253716.0. Dated: Jun. 25, 2009.
Examination Report re related European Application No. 01 905 364.4, dated: Jun. 24, 2009.
(From related application) European Office Action, Patent Application No. 02792174.1 dated Mar. 8, 2010.
(From related application) European Office Action, Patent Application No. 02769655.8 dated Mar. 3, 2010.
Saito et al., Solid-State Electronics, "Theoretical Limit Estimation of Lateral Wide Bandgap Semiconductor Power-Switching Device", Apr. 1, 2003, pp. 1555-1562.
W. Saito et al., "600V AlGaN/GaN Power-HEMT: Design, Fabrication and Demonstration on High Voltage DC-DC Converter", IEEE IEDM vol. 23, No. 7, 2003, pp. 587-590.
Extended Search Report from European Patent Application No. 11153385.7 dated Apr. 28, 2011.
Extended Search Report from European Patent Application No. 11153386.5 dated Apr. 29, 2011.
Cai Y., et al., "High-Performance Enhancement-Mode AlGaN/GaN HEMTs Using Fluoride-Based Plasma Treatment", IEEE Electron Device Letters, IEEE Service Center, NY, NY US vol. 26, No. 7, Jul. 2005 pp. 435-437, XP011135432.
Notice of Reasons for Rejection in Japanese Patent Application No. 2003-535260 mailed Apr. 26, 2011.
S. Imanaga et al., "Novel AlN/GaN Insulated Gate Heterostructure Field Effect Transistor with Modulation Doping and One-Dimensional Simulation of Charge Control", J. Appl. Phys. US, American Institute of Physics, Dec. 1, 1997, vol. 82 No. 11, p. 5843-5858.
Zhang, N-Q, et al., High Breakdown GaN HEMT with Overlapping Gate Structure, IEEE Electron Device Letters, vol. 21, No. 9, Sep. 2000, pp. 373-375.
(From related application) European Office Action, Patent Application No. 07253716.0 dated Jan. 26, 2010.
Okamoto Y. et al. "A 149W Recessed-Gate AlGaN/GaN FP-FET", Microwave Symposium Digest, vol. 3, Jun. 6, 2004, p. 1351-1354.
Green et al., "Effect of Passivation ofn AlGaN/GaN HEMT Device Performance", IEEE, XP-002239700, pp. 357362, 2000.
Lu, et al., "p-Type SiGe Transistors with Low Gate Leakage Using SiN Gate Dielectric", IEEE Electron Device Letters, vol. 20. No. 10, Oct. 1999, XP-000890470, pp. 514-516.
Notice Requesting Submission of Opinion, Korean Application No. 10-2004-7001027, Dec. 15, 2008.
Kahn, et al, "AlGaN/GaN Metal-Oxide-Semiconductor Heterostructure Field-Effect Transistors on Sic Substrates", Applied Physics Letters, vol. 77, No. 9, Aug. 2000, XP-000951319, pp. 1339-1341.
Official Notice of Rejection, mailed May 22, 2009 for Japanese Patent Application No. 2003-535260, pp. 1-4.
Official Notice of Rejection, mailed Jun. 8, 2010 for Japanese Patent Application No. 2009-243337, pp. 1-2.
Patent Abstracts of Japan, Pub. No. 2000-174260, date: Jun. 23, 2000.
Extended European search report re Application No. 08250197.4, date Nov. 6, 2008.

Examination Report for European Application No. 02 769 655.8-1235, date: Mar. 3, 2010.
Examination Report for European Application No. 01 905 364.4-2203, date: Jun. 24, 2009.
Examination Report re European Application No. 02 792 174.1-1235, Dated Oct. 7, 2008.
Xing, "High Breakdown Voltage AlGaN—GaN HEMTs Achieved by Multiple Field Plates", IEEE Electron Device Letters, vol. 25, No. 4, Apr. 2004, pp. 161-163.
Response for U.S. Appl. No. 11/603,427, filed Aug. 6, 2008.
Response for U.S. Appl. No. 11/603,427, filed May 28, 2009.
Notice of Allowance for U.S. Appl. No. 11/603,427, dated: Sep. 4, 2009.
Wu et al., "High-Gain Microwave GaN HEMTs With Source-Terminated Field-Plates", Cree Santa Barbara Technology Center.
Ping et al., "DC and Microwave Performance of High Current AlGaN Heterostructure Field Effect Transistors Grown on P-Type SiC Substrates", IEEE Electron Device Letters, vol. 19, No. 2, Feb. 1998, p. 54.
L. Eastman et al., "GaN Materials for High Power Microwave Amplifiers", Materials Research Society vol. 512 WOCSEMMAD, Monterey, CA Feb. 1998, pp. 3-7.
G. Sullivan et al., "High Power 10-GHz Operation of AlGaN HFET's in Insulating SiC", IEEE Electron Device Letters, vol. 19, No. 6, Jun. 1998, p. 198.
Y.F. Wu et al, "Very-High Power Density AlGaN/GaN HEMTs", IEEE Transactions on Electronic Devices, vol. 48, Issue 3, Mar. 2001, p. 586.
Related European Examination Report for European Patent Application No. 02769655.8, dated: Nov. 3, 2008.
Related Office Action from Japanese Patent Office re Japanese Patent Application No. 2002-590421, dated: Oct. 21, 2008.
Japanese Patent Application Public Disclosure 2000-68498, Date: Mar. 3, 2000.
Japanese Patent Application Public Disclosure 2001-77353, dated Mar. 23, 2001.
Asano K et al, "Novel High Power AlGaAs/GaAs HFET With a Field-Modulating Plate Operated at 35 V Drain Voltage", Electron Devices Meeting 1998, IEDM 98 Technical Digest, International San Francisco, CA USA Dec. 6-9, 1998, Piscataway, NJ USA IEEE US Dec. 6, 1998, pp. 59-62 XP010321500.
Wakejima A et al, "High Power Density and Low Distortion InGaP Channel FETs With Field-Modulating Plate", IEICE Transactions on Electronics, Institute of Electronics Information and Comm. Eng. Tokyo, Japan, vol. E85-C, No. 12, Dec. 2002, pp. 2041-2045.
Mok P. et al, "A Novel High-Voltage High-Speed MESFET Using a Standard GAAS Digital IC Process", IEEE Transactions on Electron Devices, IEEE Inc. New York, US, vol. 41, No. 2, Feb. 1, 1994, pp. 246-250 XP00478051.
Karmalkar S. et al. "Very High Voltage AlGaN/GaN High Electron Mobility Transistors Using a Field Plate Deposited on a Stepped Insulator", Solid State Electronics, Elsevier Science Publishers, Barking, GB, vol. 45, No. 9, Sep. 2001, pp. 1645-1652.
Li, et al, "High Breakdown Voltage GaN HFET With Field Plate", Electronics Letters, IEE Stevenage GB vol. 37, No. 3, Feb. 1, 2001, pp. 196-197, XP006016221.
Gaska, et al., "High-Temperature Performance of AlGaN/GaN HFETs on SiC Substrates", IEEE Electron Device Letters, vol. 18. No. 10, Oct. 1997, pp. 492-494.
Wu et al., "High Al-Content AlGaN/GaN HEMTs on SiC Substrates With Very-High Power Performance", IEDM-1999 Digest, pp. 925-927, Washington D.C., Dec. 1999.
Lu et al.. "AlGaN/GaN HEMTs on SiC With Over 100 GHz ft and Low Microwave Noise", IEEE Transactions on Electron Devices, vol. 48, No. 3, Mar. 2001, pp. 581-585.
Wu et al., Bias-Dependent Performance of High-Power AlGaN/GaN HEMTs, IEDM-2001, Washington D.C., Dec. 2-6, 2001, pp. 378-380.
Wu et al., "High Al-Content AlGaN/GaN MODFETs for Ultrahigh Performance", IEEE Electron Device Letters vol. 19, No. 2, Feb. 1998, pp. 50-53.

(56) References Cited

OTHER PUBLICATIONS

Zhang et al., "High Breakdown GaN HEMT With Overlapping Gate Structure", IEEE Electron Device Letters, vol. 21, No. 9, Sep. 2000, pp. 421-423.
Karmalkar et al., "Enhancement of Breakdown Voltage in AlGaN/GaN High Electron Mobility Transistors Using a Field Plate", IEEE Trans. Electron Devices, vol. 48, No. 8, Aug. 2001, pp. 1515-1521.
Ando et al., "10-W/mm AlGaN—GaN HFET With a Field Modulating Plate", IEEE Electron Device Letters, vol. 24, No. 5, May 2003, pp. 289-291.
Chini et al., Power and Linearity Characteristics of Field-Plated Recessed-Gate AlGaN—GaN HEMTs, IEEE Electron Device Letters, vol. 25, No. 5, May 2004, pp. 229-231.
Examiner's Report from Canadian Patent Application No. 2,447,058 dated Dec. 15, 2009.
Office Action from U.S. Appl. No. 11/356,791, dated: Nov. 4, 2011.
Office Action from U.S. Appl. No. 12/554,803, dated: Nov. 4, 2011.
Office Action from U.S. Appl. No. 11/726,975, dated: Nov. 8, 2011.
Inquiry from Japanese Patent Application No. 2001-557092, Appeal No. 2012-000781, dated Aug. 23, 2012.
Appeal Decision from Japanese Patent Application No. 2009-243337, dated Oct. 19, 2012.
Chini, et al, "High Breakdown Voltage AlGaN HEMTs Achieved by Multiple Field Plates", Apr. 1, 2004, IEEE Electron Device Letters, IEEE Service Center. New York, NY, pp. 161-163.
Okamoto, et al. "A 149W Recessed-Gate AlGaN/GaN FP-FET", Microwave Symposium Digest, 2004 IEEE MTT-S International, Forth Worth, TX Jun. 6-11, 2004, Piscataway, NJ, IEEE, vol. 3, Jun. 6, 2004, pp. 1351-1354.
Examination Report from European Patent Appl. No. 10 187 940.1-1555, dated Feb. 19, 2013.
Examination Report from European Patent Appl. No. 11 153 385.7-1552, dated Feb. 18, 2013.
Examination Report from European Patent Appl. No. 11 153 386.5-1552, dated Feb. 18, 2013.
"Dopant patterning in three dimensions during molecular beam epitaxial growth using an in-situ focused ion gun" by Sazio, et al., Superlattices and microstructures, vol. 20, No. 4, pp. 535 to 544 (1996).
"Comparing High-Frequency control devices", Mohamed Kameche and Mohammed Bekhti, Microwaves and RF pp. 53 to 71, Mar. 2003.
Notice of Opposition from European Patent Application No. 08250197.4-1235, dated Jan. 29, 2013.
Notification of Reasons for Rejection from Japanese Patent Application No. 2001-557092, dated Feb. 21, 2013.
Examination Report from European Patent Appl. No. 10 187 943.5-1555, dated Apr. 11, 2013.
Wu, Yi-Feng, "GaN-Based Fets for Microwave Power Amplification", IEICE Trans. Electron., vol. ES2-C, No. 11, (Nov. 1, 1999), pp. 1895-1905, XP000931553, ISSN: 0916-8524.
Appeal Decision from Japanese Patent appl. No. 2003-535260, dated Feb. 19, 2013.
Decision of Rejection from Japanese Patent Appl. No 2007-245497, dated Jan. 8, 2013.
Notice of Reasons for Rejection from Japanese Patent Appl. No. 2008-532215, dated Jan. 15, 2013.
Notices of Opposition from European Patent Appl. No. 08250197.4-1555, dated Feb. 19, 2013.
Notice of Opposition to a European Patent, filed against European Patent Appl. No. 02792174.1, dated May 31, 2013.
O Ambacher, "Growth and Applications of Group III-Nitrides", J. Phys. D: Appl. Phys., vol. 31, 1998, pp. 2653-2710.
Interrogation from Japanese Patent Appl. No. 2007-245497, dated Jul. 24, 2013.
Decision of Rejection from Japanese Patent appl. No. 2008-532215, dated Jul. 23, 2013.
Summons to Attend Oral Proceedings from European Patent appl. No. 06851411.6, dated Aug. 19, 2013.
Summons to Attend Oral Proceedings from European Patent appl. No. 11153385.7, dated Aug. 19, 2013.
Summons to Attend Oral Proceedings from European Patent appl. No. 11153386.5, dated Aug. 19, 2013.
Office Action from U.S. Appl. No. 11/356,791, dated Apr. 6, 2012.
Response to OA from U.S. Appl. No. 11/356,791, filed Sep. 6, 2012.
Office Action from U.S. Appl. No. 12/554,803, dated May 9, 2012.
Response to OA from U.S. Appl. No. 12/554,803, filed Jul. 5, 2012.
Office Action from U.S. Appl. No. 13/112,285, dated Jan. 28, 2013.
Response to OA from U.S. Appl. No. 13/112,285, filed Jun. 28, 2013.
Office Action from U.S. Appl. No. 13/112,285, dated Aug. 1, 2012.
Response to OA from U.S. Appl. No. 13/112,285, filed Dec. 3, 2012.
Office Action from U.S. Appl. No. 11/356,791, dated Sep. 5, 2013.
Office Action from U.S. Appl. No. 12/554,803, dated Sep. 5, 2013.
Notice of Opposition filed against European Patent Appl. No. 02792174.1-1555. dated Jun. 28, 2013.
Extended European Search Report from European Patent Appl. No. 11176492.4-1555, dated Jul. 19, 2013.
Decision to Grant European Patent Appl. No. 02769655.8-1555, Jul. 18, 2013.
Examiner's Report from Canadian Patent Appl. No. 2454269, dated Sep. 6, 2013.
Office Action from Japanese Patent Appl. No. 2012-081708, dated Oct. 22, 2013.
Notice of Reasons for Rejection from Japanese Patent Appl. No. 2012-106265, dated Nov. 12, 2013.
Notice of Reasons for Rejection from Japanese Patent Appl. No, 2012-081708, dated Oct. 22, 2013.
Office Action Summary from Japanese Patent appl. No. 2007-245497, dated Feb. 12, 2014.
Examination Report from Canadian Patent appl. No. 2,447,058 dated Jan. 6, 2014.
Interrogation from Japanese Patent appl. No. 2008-532215, dated Jan. 14, 2014.
Reasons for Rejection from Japanese Patent appl. No. 2012-106264, dated Nov. 12, 2013.
Reasons for Rejection from Japanese Patent appl. No. 2012-106266, dated Nov. 12, 2013.
Trial Decision from Japanese Patent appl. No. 2007-245497, dated Apr. 15, 2014.
Decision to Refuse a European Patent Appl. No. 11 153 386.5-1552 dated Apr. 10, 2014.
Office Action from Japanese Patent Appl No. 2013-025681, dated Apr. 28, 2014.
Office Action from U.S. Appl. No. 12/554,803, dated Mar. 20, 2014.
Office Action from U.S. Appl. No. 11/356,791, dated Apr. 22, 2014.
Examination Report from European Patent Appl. No. 10187940.0, dated Aug. 14, 2014.
Decision of Rejection from Japanese Patent Appl. No. 2012-106264, dated Aug. 19, 2014.
Notice of Reasons for Rejection from Japanese Patent Appl. No. 2012-106266, dated Sep. 2, 2014.
Office Action from U.S. Appl. No. 13/480,328, dated Jul. 30, 2014.
Decision of Rejection from Japanese Patent Appl. No. 2012-106265, dated Jul. 8, 2014.
Decision of Rejection from Japanese Patent Appl. No. 2012-106266, dated Jul. 15, 2014.
Notice of Opposition from European Patent Application No. 02769655.8-1555/1390983, dated Jun. 24, 2014.
Decision to Refuse from European Patent Application No. 11153385.7-1552, dated Jun. 10, 2014.
Extended European Search Report for European Patent Application No. 12153917.5, dated Jul. 11, 2012.
Chini, et al. "High Breakdown Voltage AlGaN HEMTs Achieved by Multiple Field Plates", Apr. 1, 2004, IEEE Electron Device Letters, IEEE Service Center, New York, NY, pp. 161-163.
Okamoto, et al, "A 149W Recessed-Gate AlGaN/GaN FP-FET", Microwave Symposium Digest, 2004 IEEE MTT-S International, Forth Worth, TX Jun. 6-11, 2004, Piscataway, NJ, IEEE, vol. 3, Jun. 6, 2004, pp. 1351-1354.
Summary of Invitation to Submit Applicant's Opinion from Japanese Patent Application No. 2009-243336, dated May 29, 2012.
Summary of Invitation to Submit Applicant's Opinion from Japanese Patent Application No. 2003-535260, dated May 29, 2012.

(56) References Cited

OTHER PUBLICATIONS

Hsu, et al., "Effect of polarization fields on transport properties in AlGaN/GaN heterostructures", Journal of Applied Physics, vol. 89, No. 3, Feb. 1, 2001.
Egawa, et al., "Recessed gate AlGaN/GaN modulation-doped field-effect transistors on sapphire", Applied Physics Letters, vol. 76, No. 1, Jan. 3, 2000.
Binari, et al., "AlGaN/GaN HEMTs grown on SiC substrates", Electronics letters, vol. 33, No. 3, Jan. 30, 1997.
Breitschadel, et al., "Minimization of Leakage Current of Recess Gate AlGaN/GaN HEMTs y optimizing the Dry-Etching Process", Journal of electronic Materials, vol. 28, No. 12, 1999.
Xing, et al., "Gallium nitride based transistors", Journal of Physics: Condensed Matter, vol. 13, Jul. 26, 2001.
Smorchkova, et al., "AlN/GaN and (Al,Ga)N/AlN/GaN two-dimensional electron gas structures grown by plasma-assisted molecular-beam epitaxy", Journal of Applied Physics, vol. 90, No. 10, Nov. 15, 2001.
Notice of Opposition from European Patent Appl. No. 02769655.8-1555/1390983, dated May 21, 2014.
Intention to Grant from European Patent Appl. No 06851411 6-1552, dated Jun. 6, 2014.
Summons to attend oral proceedings from European Patent Appl. No. 08250197.4-1555/1973163, dated May 23, 2014.
U.S. Appl. No. 60/290,195, filed May 11, 2001, Smorchkova, et al.
U.S. Appl. No. 10/102,272, filed Mar. 19, 2002, Chavarkar, et al.
Notice of Reasons for Rejection from Japanese Patent Application No. 2001-557092, dated Mar. 29, 2012.
Examination Report for European Patent Application No. 06 851 411.6-2203, dated Apr. 10, 2012.
Decision of Rejection from Japanese Appl. No 2012-081708, dated Dec. 9, 2014.
Pretrial Report from Japanese Appl. No. 2012-106265, dated Dec. 2, 2014.
Office Action from U.S. Appl. No. 12/554,803, dated Sep. 29, 2014.
Office Action from U.S. Appl. No. 11/356,791, dated Oct. 14, 2014.
Decision of Patent Grant from Japanese Patent Appl. No. 2012-106266, dated Feb. 3, 2015.
Notice of Allowance from Canadian Patent Appl. No. 2,454,269, dated Jan. 23, 2015.
Decision in Opposition Proceedings from European Patent Appl. No. 08 250 197.4-1555, dated Feb. 4, 2015.
Office Action from Japanese Patent Appl. No. 2013-025681, dated Mar. 10. 2015.
Yunju Sun, et al., "Large-Signal Performance of Deep Submicrometer AlGaN/AlN/GaN HEMTs With a Field-Modulating Plate", IEEE Transactions on Electron Devices, vol. 52, No. 8, Aug. 2005.
Office Action from U.S. Appl. No. 13/480,328, dated Jan. 14, 2015.
Office Action from U.S. Appl. No. 12/554,803, dated Jan. 14, 2015.
Response to OA from U.S. Appl. No. 13/554,803, filed Mar. 16, 2015.

\* cited by examiner

HIGH VOLTAGE GAN TRANSISTOR

This application is a continuation of U.S. patent application Ser. No. 13/014,619 filed on 26 Jan. 2011, now U.S. Pat. No. 8,169,005 which is a continuation of U.S. patent application Ser. No. 12/636,019 filed on 11 Dec. 2009, now issued as U.S. Pat. No. 7,893,500, which is a continuation of U.S. patent application Ser. No. 11/603,427 filed on 21 Nov. 2006, now issued as U.S. Pat. No. 7,692,263.

GOVERNMENT RIGHTS

The United States Government has rights in this invention pursuant to contract No. N00014-05-C-0226, awarded by the Office of Naval Research.

BACKGROUND OF THE INVENTION

This invention relates to semiconductors, and particularly to transistors for power switching that utilize field plates.

Power semiconductor devices are used as switches or rectifiers in power electronic circuits, such as switch mode power supplies. Common power devices include the power diode, thyristor, power MOSFET and IGBT (insulated gate bipolar transistor). A power diode or MOSFET, for example, operates on principles similar to those of its low power counterparts, but is able to carry a larger amount of current and typically can support a larger reverse-bias voltage in the off state.

Structural changes are often made in power devices to accommodate the higher current density, higher power dissipation and/or higher reverse breakdown voltage required. The vast majority of discrete (i.e., non integrated) power devices are built using a vertical structure, whereas small-signal devices employ a lateral structure. With the vertical structure, the current rating of the device is proportional to its area, and the voltage blocking capability is achieved with the height of the die. In the vertical structure, one of the connections of the device is located on the bottom of the semiconductor.

High electron mobility transistors (HEMTs) are a common type of solid state transistor that is regularly fabricated from semiconductor materials such as Silicon (Si) or Gallium Arsenide (GaAs). One disadvantage of Si is that it has low electron mobility (600-1450 $cm^2$/V-s), which produces a high source resistance that can degrade high performance gain [CRC Press, The Electrical Engineering Handbook, Second Edition, Dorf, p. 994, (1997)].

GaAs based HEMTs have become the standard for signal amplification in civil and military radar, handset cellular, and satellite communications. GaAs has a higher electron mobility (approximately 6000 $cm^2$/V-s) and a lower source resistance than Si, which allows GaAs based devices to function at higher frequencies. However, GaAs, like silicon, has a relatively small bandgap (1.12 eV for silicon and 1.42 eV for GaAs at room temperature) and relatively small breakdown voltage, which prevents GaAs and silicon based HEMTs from providing high power at high frequencies.

In response to these disadvantages with the Si and GaAs materials systems for high power applications, a major breakthrough in power semiconductor devices was achieved with the replacement of silicon by wide bandgap semiconductor, such as silicon carbide (SiC) and the Group III nitrides, e.g., gallium nitride (GaN). These materials typically exhibit higher electric field breakdown strength and higher electron saturation velocity as compared to GaAs and Si. Silicon carbide MOSFETS, for example, deliver 10 to 100 times better performance (or smaller size) than equivalent silicon based devices. SiC Schottky diodes with a breakdown voltage of 1200V are commercially available. As both are majority carrier devices, they can operate at high speed. Bipolar devices are being developed for higher voltages, up to 20 kV. Among its advantages, silicon carbide can operate at higher temperature (up to 400° C.) and has a lower thermal resistance than silicon, allowing better cooling.

In particular, GaN power HEMTs not only exhibit higher efficiency than both SiC and Si MOSFETs, but also perform well at higher frequencies, where Si simply does not function. GaN has the highest figure of merit of any semiconductor device for power switching. GaN HEMTs, owing to their high electron mobility and high breakdown field, exhibit a Baliga DC figure of merit for high voltage power devices which is superior to all other available semiconductors, resulting in ultra-low on resistance and a compact die size.

HEMTs can offer operational advantages in many circumstances because a two dimensional electron gas (2DEG) is formed in the HEMT structure at the heterojunction of two semiconductor materials with different bandgap energies, where the smaller bandgap material has a higher electron affinity. The 2DEG is an accumulation layer in the undoped, smaller bandgap material, and can contain a very high sheet electron concentration, in excess of, for example, $1 \times 10^{13}$ carriers/$cm^2$. In addition, electrons originating in the wider bandgap semiconductor transfer to the 2DEG, allowing a high electron mobility due to reduced ionized impurity scattering. The combination of high carrier concentration and high carrier mobility can give the HEMT a very large transconductance and may provide a strong performance advantage over metal-semiconductor field effect transistors (MESFETs) for high frequency applications.

Innovations in GaN HEMT device technology have increased the breakdown voltage as well as the power performance for devices operable at RF and microwave frequencies greater than 0.5 GHz. High electron mobility transistors fabricated in the gallium nitride/aluminum gallium nitride (GaN/AlGaN) material system have the potential to generate large amounts of RF power because of the combination of material characteristics that includes the aforementioned high breakdown fields, wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Improvements in the manufacture of wide bandgap semiconductor materials, such as AlGaN/GaN, have helped advance the development of AlGaN/GaN transistors, such as high electron mobility transistors (HEMTs), for high frequency, high temperature and high power applications. AlGaN/GaN has large bandgaps, as well as high peak and saturation electron velocity values [B. Gelmont, K. Kim and M. Shur, Monte Carlo Simulation of Electron Transport in Gallium Nitride, J. Appl. Phys. 74, (1993), pp. 1818-1821]. AlGaN/GaN HEMTs can also exhibit two dimensional electron gas (2DEG) layer sheet densities in excess of $10^{13}$/$cm^2$ and relatively high electron mobility (up to 2019 $cm^2$/Vs) [R. Gaska, et al., Electron Transport in AlGaN—GaN Heterostructures Grown on 6H-SiC Substrates, Appl. Phys. Lett. 72, (1998), pp. 707-709]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., GaN-Based FETs for Microwave Power Amplification, IEICE Trans. Electron. E-82-C, (1999). pp. 1895-1905]. More recently, AlGaN/GaN HEMTs grown on SiC have shown a power density of 30 W/mm at 8 GHz [Y.-F. Wu, A. Saxler, M. Moore, R. P. Smith, S. Sheppard, P. M. Chavarkar, T. Wisleder, U. K. Mishra, and P. Parikh, "30-W/mm GaN HEMTs by Field Plate Optimization", IEEE Electron Device Letters, Vol. 25, No. 3, pp. 117-119, March 2004.] and a total output power of 22.9 W at 9 GHz [M. Micovic, et al., AlGaN/GaN Heterojunction Field Effect Transistors Grown by Nitrogen Plasma Assisted Molecular Beam Epitaxy, IEEE Trans. Electron. Dev. 48, (2001), pp. 591-596].

U.S. Pat. No. 5,192,987 discloses GaN/AlGaN based HEMTs grown on a buffer and a substrate. Other AlGaN/GaN HEMTs and field effect transistors (FETs) have been described by Gaska, et al., High-Temperature Performance of AlGaN/GaN HFETs on SiC Substrates, IEEE Electron Device Letters, 18, (1997), pp. 492-494; and Wu, et al. "High Al-content AlGaN/GaN HEMTs With Very High Performance", IEDM-1999 Digest, pp. 925-927, Washington D.C., December 1999. Some of these devices have shown a gain-bandwidth product ($f_T$) as high as 100 gigahertz (Lu, et al. "AlGaN/GaN HEMTs on SiC With Over 100 GHz ft and Low Microwave Noise", IEEE Transactions on Electron Devices, Vol. 48, No. 3, March 2001, pp. 581-585) and high power densities up to 10 W/mm at X-band (Wu et al., "Bias-dependent Performance of High-Power AlGaN/GaN HEMTs", IEDM-2001, Washington D.C., Dec. 2-6, 2001) and Wu et al., High Al-Content AlGaN/GaN MOSFETs for Ultrahigh Performance, IEEE Electron Device Letters 19, (1998), pp. 50-53].

Electron trapping and the resulting differences between DC and RF characteristics have been a limiting factor in the performance of these devices. Silicon nitride (SiN) passivation has been successfully employed to alleviate this trapping problem, resulting in high performance devices with power densities over 10 W/mm at 10 Ghz. U.S. Pat. No. 6,586,781, for example, which is incorporated herein by reference in its entirety, discloses methods and structures for reducing the trapping effect in GaN-based transistors. Due to the high electric fields existing in these structures, however, charge trapping is still an issue.

Overlapping gate structures, or field plates, have been used to modify the electric field and thereby enhance the performance of GaN-based HEMTs at microwave frequencies. See Zhang et al., IEEE Electron Device Letters, Vol. 21, pp. 421-423 (September 2000). Karmalkar et al. performed simulations for the field plate structure, predicting up to five times enhancement in breakdown voltages. Karmalkar et al., IEEE Trans. Electron Devices, Vol. 48, pp. 1515-1521 (August 2001). Ando et al. used a similar structure with smaller gate dimensions and demonstrated performance of 10.3 W output power at 2 GHz using a 1 mm wide device on a SiC substrate. Ando et al., IEEE Electron Device Letters, Vol. 24, pp. 289-291 (May 2003). Chini et al. implemented a new variation of the field plate design with further reduced gate dimensions and obtained 12 W/mm at 4 GHz from a 150 μm-wide device on a sapphire substrate. Chini et al., IEEE Electron Device Letters, Vol. 25, No. 5, pp. 229-231 (May 2004). GaN based HEMTs with field plates have boosted power density to greater than 30 W/mm at frequencies up to 8 GHz. See, e.g., Y-F Wu et al, IEEE Electron Device Letters, Vol. 25, No. 3, pp. 117-119 (March 2004).

The approaches known in the art, however, have limitations for high performance applications in power switching. Consequently, a need has developed in the art for power switching devices which performance well at high frequencies, including higher breakdown voltages and lower on resistances.

BRIEF SUMMARY OF THE INVENTION

This invention provides multiple field plate transistors which can maintain high blocking voltages, of 600 Volts and greater, while simultaneously exhibiting on resistances of 7.0 mΩ-cm² or lower.

A multiple field plate transistor constructed according to the invention includes an active region, a source electrode in electrical contact with the active region, a drain electrode in electrical contact with the active region, and a gate, in electrical contact with the active region, between the source and the drain.

A first insulating spacer layer is disposed over the active region between the source and the gate, while a second insulating spacer layer is disposed over the active region between the drain and the gate.

A first conducting field plate, disposed on the first spacer layer between the source and the gate, is electrically connected to the gate and extends toward the source. A second conducting field plate, disposed on the second spacer layer between the drain and the gate, is electrically connected to the gate and extends toward the drain.

A third insulating spacer layer is disposed on the first spacer layer, the second spacer layer, the first field plate, the gate, and the second field plate between the source and the drain. A third conducting field plate is disposed on the third spacer layer over the gate, the second field plate, and the second spacer layer, and is electrically connected to the source, extending toward the drain.

The transistor may be variously configured:

to exhibit a blocking voltage of at least 600 Volts while supporting a current of at least 2 Amps with an on resistance of no more than 5.0 mΩ-cm²;

to exhibit a blocking voltage of at least 600 Volts while supporting a current of at least 3 Amps with an on resistance of no more than 5.3 mΩ-cm²;

to exhibit a blocking voltage of at least 900 Volts while supporting a current of at least 2 Amps with an on resistance of no more than 6.6 mΩ-cm²; or to exhibit a blocking voltage of at least 900 Volts while supporting a current of at least 3 Amps with an on resistance of no more than 7.0 mΩ-cm².

In a more particular embodiment, the transistor is a high electron mobility transistor (HEMT) and includes a substrate, a buffer layer on the substrate, and a barrier layer on the buffer layer, the active region being defined by a two dimensional electron gas induced at the heterointerface between the buffer layer and the barrier layer.

In specific configurations, the HEMT embodiment may include a gate that is partially recessed in the barrier layer, a semi-insulating SiC substrate, a GaN buffer layer, an AlN barrier layer, a barrier layer which includes both an AlN layer and an AlGaN layer, spacer layers of SiN, and/or metal field plates.

The invention also encompasses:

A multiple field plate transistor configured to exhibit a blocking voltage of at least 600 Volts while supporting a current of at least 2 Amps with an on resistance of no more than 5.0 mΩ-cm$^2$;

a multiple field plate transistor configured to exhibit a blocking voltage of at least 600 Volts while supporting a current of at least 3 Amps with an on resistance of no more than 5.3 mΩ-cm$^2$;

a multiple field plate transistor configured to exhibit a blocking voltage of at least 900 Volts while supporting a current of at least 2 Amps with an on resistance of no more than 6.6 mΩ-cm$^2$; and a multiple field plate transistor configured to exhibit a blocking voltage of at least 900 Volts while supporting a current of at least 3 Amps with an on resistance of no more than 7.0 mΩ-cm$^2$.

DETAILED DESCRIPTION OF THE INVENTION

Figure 1:
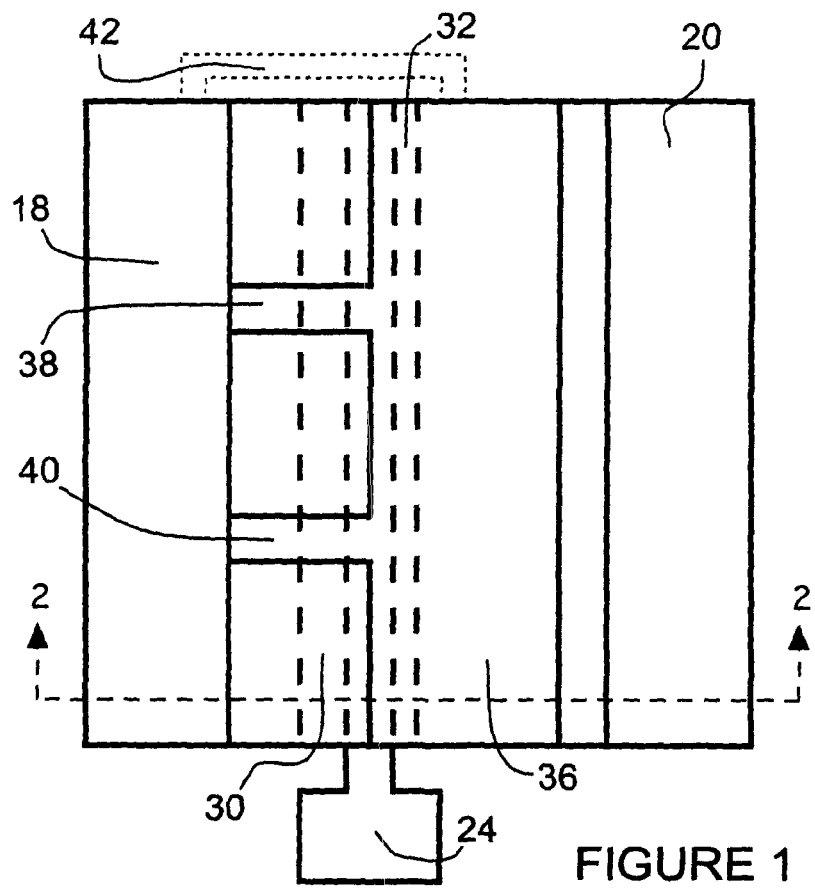
FIG. 1 is a plan view of one embodiment of a high electron mobility transistor (HEMT) constructed according to the present invention.

This invention provides multiple field plate transistors that exhibit increased breakdown voltage and improved power performance, characteristics that are particularly advantageous for power switching applications. In some embodiments, for example, the invention provides transistors with a blocking voltage of at least 600 Volts, while supporting a current of at least 2 Amps with an on resistance of no more than 5.0 mΩ-cm$^2$, and at least 3 Amps, with an on resistance of no more than 5.3 mΩ-cm$^2$; and with a blocking voltage of at least 900 Volts while supporting a current of at least 2 Amps, with an on resistance of no more than 6.6 mΩ-cm$^2$, and at least 3 Amps, with an on resistance of no more than 7.0 mΩ-cm$^2$.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. As well understood by those in this art, the Group III elements can combine with nitrogen to form binary (e.g., GaN), ternary (e.g., AlGaN and AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$, where $0 \leq x \leq 1$, are often used to describe them.

The multiple field plate transistor of the present invention includes an active region, with metal source and drain electrodes in electrical contact with the active region, and a gate between the source and drain electrodes for modulating electric fields within the active region. A first insulating spacer layer is positioned over at least a portion of the active region between the source and the gate. The first spacer layer, which can be formed of a dielectric layer or a combination of multiple dielectric layers, preferably covers the active region between the gate and source electrodes, although it can cover less.

A second insulating spacer layer is positioned over at least a portion of the active region between the drain and the gate. As with the first spacer layer, the second spacer layer can be formed of a dielectric layer or a combination of multiple dielectric layers, and preferably covers the active region between the gate and source electrodes, although it can cover less.

A first conductive field plate is located on the first spacer layer, is electrically connected to the gate, and extends toward the source, with the first spacer layer providing electrical isolation between the first field plate and the active region. A second conductive field plate, also electrically connected to the gate, is located on the second spacer layer and extends toward the drain, the second spacer layer providing electrical isolation between the second field plate and the active region.

A third insulating spacer layer, positioned over the first and second spacer layers, the first and second field plates, and the gate, is located between the source and the drain. A third conductive field plate, located on the third spacer layer, is positioned over the gate, the second field plate and the second spacer, is electrically connected to the source, and extends toward the drain, with the third spacer layer isolating the third field plate.

This field plate arrangement helps to reduce the peak electric field in the transistor, resulting in increased breakdown voltage and reduced trapping. The reduction of the electric field can also yield other benefits, such as reduced leakage currents and enhanced reliability. By having a field plate electrically connected to the source electrode, the reduced gain and instability resulting from gate connected field plates is reduced. When arranged according to the present invention, the shielding effect of a source-connected field plate can reduce capacitance between the gate and the drain ($C_{gd}$), which enhances input-output isolation.

Figure 2:
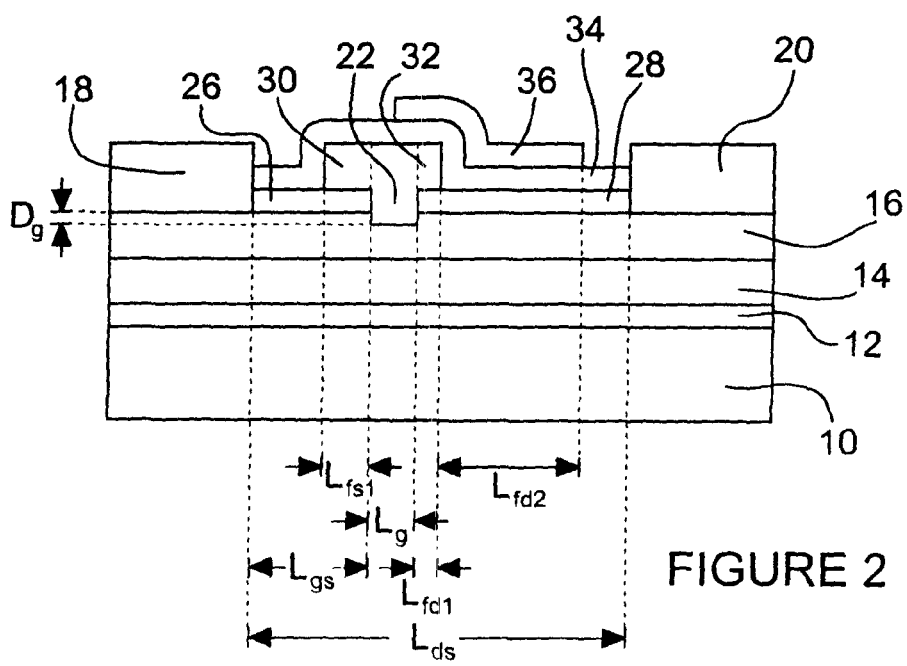
FIG. 2 is a cross sectional view showing the HEMT depicted in FIG. 1.

One type of transistor that can effectively utilize the multiple field plate arrangement of the present invention is a high electron mobility transistor (HEMT). A HEMT constructed according to the present invention is shown in FIGS. 1 and 2, where FIG. 1 is a plan view of the HEMT and FIG. 2 is a cross sectional view. The HEMT includes a substrate 10, which may be a semi-insulating silicon carbide (SiC) substrate such as, for example, a 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Appropriate SiC substrates are manufactured by, for example, Cree, Inc., of Durham, N.C., the assignee of the present invention, and methods for producing such materials are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like, or any other material or combination of materials capable of supporting growth of a Group III nitride material.

Optional nucleation and/or transition layers may be provided on the substrate 10. A nucleation layer 12, for example, is shown in FIG. 2. Whether a nucleation layer is employed can depend on the material used for the substrate. The nucleation layer provides an appropriate crystal structure transition to reduce the lattice mismatch between the substrate and the next layer in the device. Methods of forming a nucleation layer on various substrates, for example, are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554, each of which is incorporated herein by reference as if fully set forth herein. The nucleation layer 12 should be approximately 1000 Å thick, although other thicknesses can be used. The nucleation layer can be deposited on the substrate using many different materials, with a suitable material being $Al_xGa_{1-x}N$ ($0 \leq x \leq 1$), and using known semiconductor growth techniques, such as Metal Oxide Chemical Vapor Deposition (MOCVD), Hydride Vapor Phase Epitaxy (HVPE), or Molecular Beam Epitaxy (MBE).

Additionally, a strain balancing transition layer or layers may also be included as described, for example, in commonly assigned US Patent Application Publication Nos. 20030102482 and 20040012015, the disclosures of which are incorporated herein by reference as if set forth fully herein.

A high resistivity GaN buffer layer 14 is deposited on the substrate 10, using the transitional structure provided by the nucleation layer 12. The buffer layer 14 may be under compressive strain. Furthermore, the buffer layer, as well as the other layers such as the nucleation and transition layers, may be deposited by MOCVD (Metal Organic Chemical Vapor Deposition) or by other semiconductor growth techniques known to those skilled in the art, such as MBE (Molecular Beam Epitaxy) or HVPE (Hydride Vapor Phase Epitaxy).

The buffer layer can be fabricated with doped or undoped layers of Group III nitride materials, with a preferred buffer layer made of a Group III nitride material such as $Al_xGa_yIn_{1-x-y}N$ ($0 \leq x \leq 1$, $0 \leq y \leq 1$, $x+y \leq 1$).

A barrier layer 16 is deposited on the buffer layer 14, the buffer layer having a bandgap that is less than the bandgap of the barrier layer and having a larger electron affinity than the barrier layer. Like the buffer layer 14, the barrier layer 16 can be doped or undoped layers of Group III nitride materials. The barrier Layer may be AlN or, in certain embodiments, the barrier layer may include multiple layers, such as an AlN layer and an AlGaN layer. Examples of suitable barrier layer are described in U.S. Pat. Nos. 6,316,793, 6,586,781, and 6,548,333, as well as US Patent Application Publication Nos. 20020167023 and 200300020092, each of which is incorporated by reference as though fully set forth herein. Other nitride based HEMT structures are illustrated in U.S. Pat. Nos. 5,192,987 and 5,296,395, the disclosures of which are incorporated herein by reference as if set forth fully herein.

The barrier layer, for example, may include an AlN layer having a thickness of about 0.8 nm and an AlGaN layer having 24% Al and a thickness of about 250 Å. The barrier layer should be thick enough, and should have a high enough Al composition and doping, to induce a significant carrier concentration at the interface between the buffer layer 14 and the barrier layer 16 through polarization effects. This causes a two dimensional electron gas (2DEG), known as the active region, to be formed at the heterointerface between the buffer layer and the barrier layer.

A source contact 18 and a drain contact 20 are provided as ohmic contacts to the barrier layer 16. Ohmic contacts are processed (e.g., by annealing) to provide low resistivity connections through the barrier layer to the active region. A gate contact 22 on the barrier layer may extend into the barrier layer to a depth $D_g$. As shown in FIG. 1, an external electrical connection 24 may be provided to the gate 22. Electric current can flow between the source and drain electrodes through the 2DEG that is induced at the heterointerface between the buffer layer and the barrier layer when the gate is biased at the appropriate level.

The source and drain electrodes 18 and 20 can be made of a variety of materials including, but not limited to, alloys of titanium, aluminum, gold and nickel. The gate 22 can also be made of different materials including, but not limited to, gold, nickel, platinum, titanium, chromium, alloys of titanium and tungsten, and platinum silicide. The length $L_g$ of the gate 22 can vary, with a suitable length being in the range of 0.1 to 2 μm, although other gate lengths can be used. In one embodiment according to the present invention a preferred gate length $L_g$ is approximately 0.5 μm.

A first insulating spacer layer 26 is deposited on the barrier layer between the source and the gate, while a second insulating spacer layer 28 is deposited on the barrier layer between the drain and the gate. Optionally, the layers 26 and 28 may be initially formed as a single layer, which is subsequently etched through to form the gate 22. The spacer layers 26 and 28 can be dielectric layers or a combination of multiple dielectric layers. Different dielectric materials can be used, such as SiN, $SiO_2$, Si, Ge, $MgO_x$, $MgN_x$, ZnO, $SiN_x$, $SiO_x$, as well as alloys and layer sequences thereof. The spacer layer can be many different thicknesses, with a suitable range of thicknesses being approximately 0.05 to 2 μm.

When the spacer layers are formed before device metallization, the layers can be an epitaxial material, such as a Group III nitride material having different Group III elements, such as alloys of Al, Ga, or In, with a suitable spacer layer material being $Al_xGa_{1-x}N$ ($0.1 \leq x \leq 1$). After epitaxial growth of the barrier layer 16, the spacer layers 26 and 28 can be grown using the same epitaxial growth method.

A first conducting field plate 30 on the spacer layer 26, between the source and the gate, is electrically connected to the gate 22. A second conducting field plate 32 on the spacer layer 28, between the drain and the gate, is also electrically connected to the gate. The field plates 30 and 32 can be formed from many different conductive materials, with a suitable material being a metal deposited using standard metallization techniques. Transistors with field plates and methods of fabricating such transistors are described, for example, in US Patent Application Publication Nos. 20050051796 and 20050051800, and International Application Publication No. WO/2005/024909, the disclosures of which are incorporated herein by reference as if set forth in their entirety.

A third insulating spacer layer 34 is formed over the first and second spacer layers 26 and 28, the first and second field plates 30 and 32, and the gate 22, between the source and the drain. This spacer layer can be formed of materials and by processes similar to those discussed above with respect to the first and second spacer layers.

A third conducting field plate 36 is deposited on the third spacer layer over the gate, the second field plate, and the second spacer layer, extend toward the drain and electrically connected to the source. The third field plate may be electrically connected to the source in a variety of ways. FIG. 1 shows, for example, a connection via the conductive buses 38 and 40. Alternatively, an external bus 42 can make the connection. Other connection structures could also be used. Different numbers of buses can be used although the more buses employed, the greater the unwanted capacitance that may be introduced. There should be a sufficient number of buses so that current can effectively spread from the source into the field plate, while covering as little of the HEMT's active region as possible, in order to minimize the amount of undesirable capacitance that is introduced.

After deposition of the third field plate and its connection to the source electrode, the active structure can be covered by a dielectric passivation layer (not shown), such as silicon nitride. Methods of forming the dielectric passivation layer are described in detail in the patents and publications referenced above.

Figure 3:
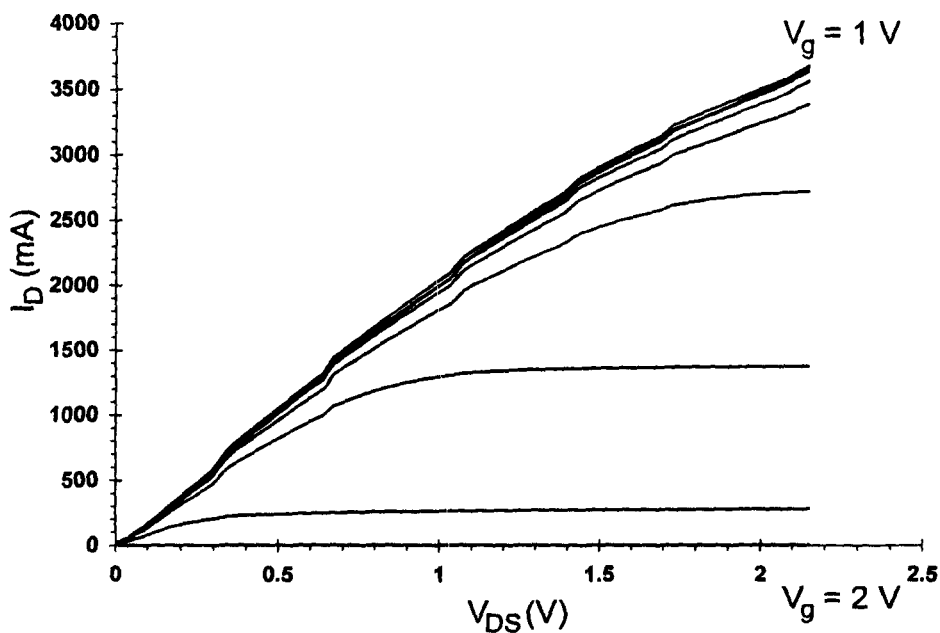
FIG. 3 is a plot of drain current $I_D$ versus drain-to-source voltage $V_{DS}$, showing the performance of a 600 V HEMT constructed according to the present invention at various gate voltages between 1 V and −2V.
Figure 4:
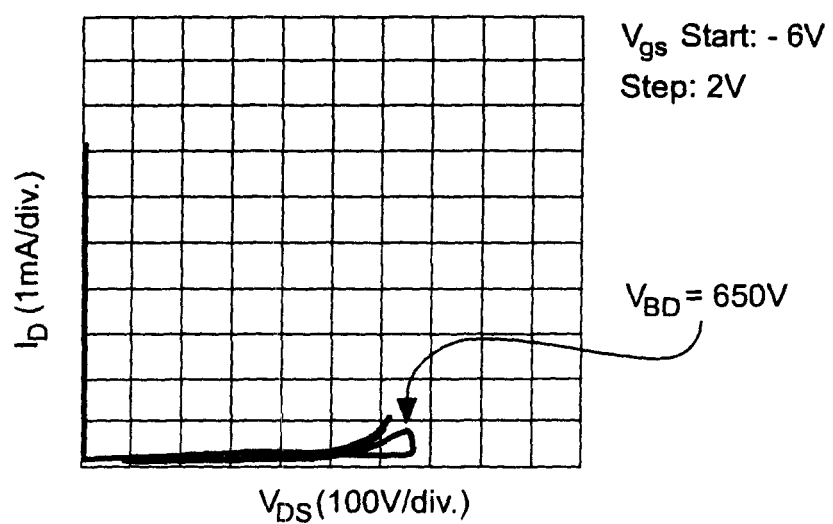
FIG. 4 is a plot of drain current $I_D$ versus drain-to-source voltage $V_{DS}$, showing that the HEMT represented in FIG. 3 achieved a blocking voltage of 600 V.

Performance results were obtained for devices fabricated similar to the HEMT illustrated in FIGS. 1 and 2. As shown in FIGS. 3 and 4, a blocking voltage of greater than 600 V was achieved with an on resistance of less than 5.0 mΩ-cm$^2$, in a device capable of carrying a 2 A current. This device also exhibited an on resistance of less than 5.3 mΩ-cm$^2$ while carrying 3 A of current. The device was a GaN HEMT on a SiC substrate, with a device area of 0.01 cm$^2$ (1×1 mm$^2$) and a barrier layer that included an AlN layer with a thickness of 4 Å and an AlGaN layer with a thickness of 250 Å. The thickness of the first spacer layer was 0, the second spacer layer approximately 1200 Å, and the third spacer layer approximately 1500 Å. Design dimensions included (referring to FIG. 2) a gate contact length $L_g$ of 1.2 μm, distance from gate to drain $L_{gd}$ of 13.3 μm, distance from drain to source $L_{ds}$ of 16 μm, second field plate width $L_{fd1}$ of 1.8 μm, and third field plate width $L_{fd2}$ of 4.5 μm.

FIG. 3 is a plot of drain current $I_D$ versus drain-to-source voltage $V_{DS}$, for this device, for gate voltages $V_g$ varying from 1 V to 2 V. FIG. 4 shows that the device achieved a blocking voltage $V_{BD}$ of 600 V.

Figure 5:
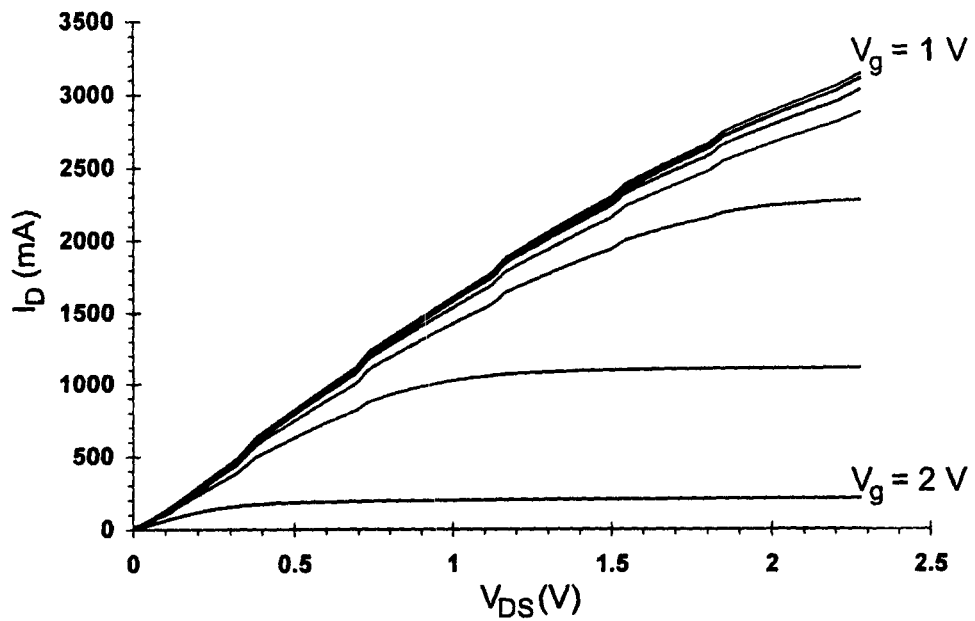
FIG. 5 is a plot of drain current $I_D$ versus drain-to-source voltage $V_{DS}$, showing the performance of a 900 V HEMT constructed according to the present invention at various gate voltages between 1 V and −2V.
Figure 6:
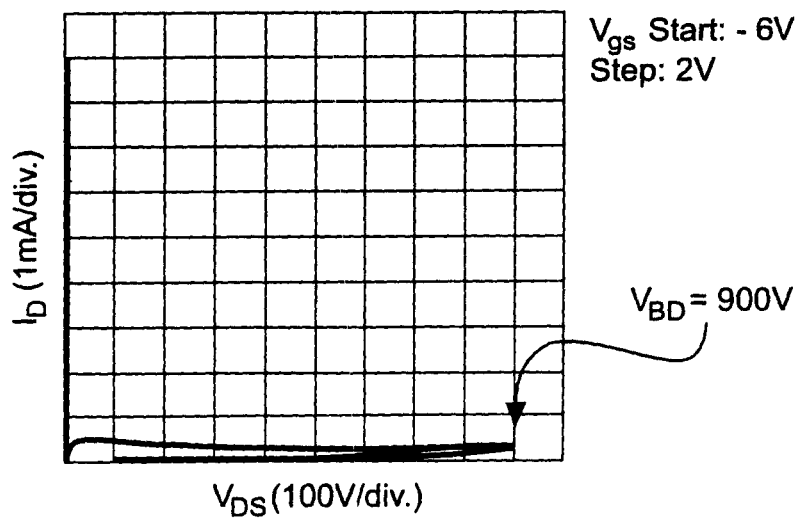
FIG. 6 is a plot of drain current $I_D$ versus drain-to-source voltage $V_{DS}$, showing that the HEMT represented in FIG. 5 achieved a blocking voltage of over 900 V.

As shown in FIGS. 5 and 6, a blocking voltage of greater than 900 V was achieved with an on resistance of less than 6.6 mΩ-cm$^2$, in a device capable of carrying a 2 A current. This device also exhibited an on resistance of less than 7.0 mΩ-cm$^2$ while carrying 3 A of current. The device was a GaN HEMT on a SiC substrate, with a device area of 0.01 cm$^2$ (1×1 mm$^2$) and a barrier layer that included an AlN layer with a thickness of 4 Å and an AlGaN layer with a thickness of 250 Å. The thickness of the first spacer layer was 0, the second spacer layer approximately 1200 Å, and the third spacer layer approximately 1500 Å. Design dimensions included (referring to FIG. 2) a gate contact length $L_g$ of 1.5 μm, distance from gate to drain $L_{gd}$ of 18.0 μm, distance from drain to source $L_{ds}$ of 21.5 μm, second field plate width $L_{fd1}$ of 1.5 μm, and third field plate width $L_{fd2}$ of 4.5 μm.

FIG. 5 is a plot of drain current $I_D$ versus drain-to-source voltage $V_{DS}$ for this device, for gate voltages $V_g$ varying from 1 V to −2 V. FIG. 6 shows that the device achieved a blocking voltage $V_{BD}$ of 900 V.

While embodiments of the present invention are described with reference to particular structures, other structures and/or techniques for fabricating the inventive devices could also be utilized in some embodiments of the invention. Such structures and/or techniques may include those described, for example, in US commonly assigned U.S. Pat. No. 6,316,793 "Nitride Based Transistors on Semi-Insulating Silicon Carbide Substrates", US Patent Application Publication No. 2002/0066908 "Aluminum Gallium Nitride/Gallium Nitride High Electron Mobility Transistors having a Gate Contact on a Gallium Nitride Based Cap Segment and Methods of Fabricating Same", US Patent Application Publication No. 2002/0167023 "Group III Nitride Based High Electron Mobility Transistor (HEMT) with Barrier/Spacer Layer", US Patent Application Publication No. 20040061129 "Nitride-based Transistors and Methods of Fabrication Thereof Using Non-Etched Contact Recesses", US Patent Application Publication No. 20050173728 "Nitride Heterojunction Transistors Having Charge-Transfer Induced Energy Barriers and Methods of Fabricating the Same", US Patent Application Publication No. 20060019435 "Methods of Fabricating Nitride-Based Transistors with a Cap Layer and a Recessed Gate", US Patent Application Publication No. 20050258451 "Methods of Fabricating Nitride-Based Transistors having Regrown Ohmic Contact Regions and Nitride-Based Transistors having Regrown Ohmic Contact Regions", US Patent Application Publication No. 20050258450 "Semiconductor Devices having a Hybrid Channel Layer, Current Aperture Transistors and Methods of Fabricating Same", US Patent Application Publication No. 20030020092 "Insulating Gate AlGaN/GaN HEMT", and US Patent Application Publication No. 20060108606 "Cap Layers and/or Passivation Layers for Nitride-Based Transistors, Transistor Structures and Methods of Fabricating Same," the disclosures of which are incorporated herein as if described in their entirety.

Note that the terminology used in this specification describes particular embodiments only and is not intended to be limiting of the invention. In the drawings, the thicknesses of such components as layers and regions may be exaggerated for clarity. Like numbers refer to like elements throughout the specification. The term "and/or" includes any and all combinations of one or more of the associated listed items.

The singular forms "a", "an" and "the" are intended to include the plural forms as well, unless the context clearly indicates otherwise. The terms "comprises" and/or "comprising," when used in this specification, identify the presence of stated features, integers, steps, operations, elements, and/or components, but do not preclude the presence or addition of one or more other features, integers, steps, operations, elements, components, and/or groups thereof.

When an element, such as a layer, region or substrate, is referred to as being "on" or extending "onto" another element, it can be directly on or extend directly onto the other element or intervening elements may also be present. In contrast, when an element is referred to as being "directly on" or extending "directly onto" another element, there are no intervening elements present. In addition, when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

Although the terms first, second, etc. may be used to describe various elements, such as components, regions, layers and/or sections, these elements are not limited by these terms. Rather, the terms are used to distinguish one element, component, region, layer or section from another. Thus, for example, a first element, component, region, layer or section could be termed a second element, component, region, layer or section without departing from the teachings of the present invention.

Relative terms, such as "lower" or "bottom" and "upper" or "top," may be used to describe one element's relationship to another element as illustrated in the drawings. Such relative terms are intended to encompass different orientations of the device in addition to the orientation depicted in the drawings. If a device in a drawing is turned over, for example, elements described as being on the "lower" sides of other elements would then be oriented on the "upper" sides of the other elements. The exemplary term "lower" can therefore encompass both "lower" and "upper," depending on the particular orientation of the drawing figure. Similarly, the exemplary terms "below" or "beneath" can encompass both above and below orientations. Furthermore, the term "outer" may be used to refer to a surface and/or layer that is farthest away from a substrate.

Embodiments of the invention are described with reference to plan view, cross sectional, and/or other illustrations that schematically depict idealized embodiments of the present invention. Consequently, variations from the shapes of the illustrations as a result, for example, of manufacturing techniques and/or tolerances, are to be expected. Embodiments of the invention should thus not be construed as limited to the particular shapes illustrated but include deviations that result, for example, from manufacturing. An etched region depicted as a rectangle, for example, will in reality typically have tapered, rounded or curved features. References to a structure or feature that is disposed "adjacent" another feature may have portions that overlap or underlie the adjacent feature.

Unless otherwise defined, all terms used herein, including technical and scientific terms, have the meanings commonly understood by one of ordinary skill in the art to which this invention pertains. Furthermore, terms such as those defined in commonly used dictionaries should be interpreted as having a meaning that is consistent with their meaning in the context of the relevant art; such terms should not be interpreted in an idealized or overly formal sense unless expressly so defined herein.

Although the invention has been described and illustrated in detail by referring to certain preferred configurations, other versions, including modifications and additional embodiments, will undoubtedly be apparent to those skilled in the art. The field plate arrangement, for example, can be used in many different devices. The field plates can also have many different shapes and can be connected to the source contact in many different ways. In addition, although the invention is particularly useful for power switching applications, it can be used as well for other applications, such as, for example, DC-DC converters for switched mode power supplies and high voltage motor drives to help increase efficiency and reduce size in such systems. Accordingly, the spirit and scope of the invention should not be limited to the embodiments of the invention as described in this specification. Rather, these embodiments are provided to make this disclosure thorough and complete, and to fully convey the scope of the invention to those skilled in the art.

Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are intended to define the full scope of the invention.

The invention claimed is:

1. A transistor device, comprising:
an active region;
source and drain electrodes in electrical contact with said active region;
a gate electrode between said source and drain electrodes and in electrical contact with said active region;
a plurality of field plates on said active region, wherein a first of said field plates is integral with said gate electrode and extends toward said source electrode and a second of said field plates is integral with said gate electrode extending toward said drain electrode, said first field plate extending a greater distance toward said source electrode than said second field plate extends toward said drain electrode without contacting said source electrode; and
wherein said field plates are configured such that the transistor exhibits a blocking voltage of at least 600 Volts while supporting a current of at least 2 Amps.

2. The transistor of claim 1, comprising an on resistance of less than 5.0 m$\Omega$-cm$^2$.

3. The transistor of claim 1, supporting a current of at least 3 Amps with an on resistance of less than 5.3 m$\Omega$-cm$^2$.

4. The transistor of claim 1, further comprising an insulating layer below each of said field plates.

5. The transistor of claim 1, further comprising a plurality of insulating spacer layers, a first of said spacer layers interposed between a first of said field plates and said active region, others of said spacer layers on said first field plate.

6. The transistor of claim 1, wherein at least one of said field plates is electrically connected to said gate electrode structure.

7. The transistor of claim 5, wherein a first one of said field plates is integral to said gate electrode and extends on said first spacer layer toward said source electrode, and wherein at least one field plate is connected to said source electrode.

8. The transistor device of claim 1, wherein an outermost of said field plates is farthest from said gate electrode, said outermost field plate electrically connected to said source electrode.

9. The transistor device of claim 8, wherein said outermost field plate is electrically connected to said source through at least one conductive bus extending from said outermost field plate to said source electrode.

10. The transistor device of claim 8, wherein said outermost field plate is connected to said source through a conductive bus, at least a portion of said conductive bus external to the footprint of said active region.

11. The transistor device of claim 7, wherein a second of said field plates is integral to said gate electrode and extends on said first spacer layer toward said drain.

12. A transistor device, comprising:
an active region;
source and drain electrodes in electrical contact with said active region;
a gate electrode comprising a gate length, said gate electrode between said source and drain electrodes and in electrical contact with said active region;
a plurality of field plates on said active region, wherein a first of said field plates is integral with said gate electrode and extends toward said source electrode a distance equal to or longer than said gate length and a second of said field plates is integral with said gate electrode extending toward said drain electrode, said first field plate extending a greater distance toward said source electrode than said second field plate extends toward said drain electrode without contacting said source electrode; and wherein said field plates are configured such that transistor exhibits a blocking voltage of at least 900 Volts while supporting a current of at least 2 Amps.

13. The transistor device of claim 12, comprising an on resistance of less than 6.6 mΩ-cm².

14. The transistor device of claim 12, exhibiting a blocking voltage of at least 900 Volts while supporting a current of at least 3 Amps with an on resistance of less than 7.0 mΩ-cm².

15. A transistor, comprising:
an active region;
source and drain electrodes in electrical contact with said active region;
a gate electrode between said source and drain electrodes and in electrical contact with said active region;
a plurality of field plates on said active region, a first and second of said field plates integral with said gate electrode and extending toward said source and drain electrodes respectively, wherein said first field plate is longer than said second field plate and does not contact said source electrode; and an outermost field plate of said plurality of field plates that is farthest from said gate electrode is electrically connected to said source electrode.

16. The transistor of claim 15, further comprising a plurality of insulating spacer layers, a first of said spacer layers interposed between a first of said field plates and said active region, others of said spacer layers on said first field plate to isolate others of said field plates from the layers below.

17. The transistor of claim 15, exhibiting a blocking voltage of at least 600 Volts while supporting a current of at least 2 Amps with an on resistance of less than 5.0 mΩ-cm².

18. The transistor of claim 15, exhibiting a blocking voltage of at least 600 Volts while supporting a current of at least 3 Amps with an on resistance of less than 5.3 mΩ-cm².

19. The transistor of claim 15, exhibiting a blocking voltage of at least 900 Volts while supporting a current of at least 2 Amps with an on resistance of less than 6.6 mΩ-cm².

20. The transistor of claim 15, exhibiting a blocking voltage of at least 900 Volts while supporting a current of at least 3 Amps with an on resistance of less than 7.0 mΩ-cm².

21. The transistor of claim 15, further comprising a high electron mobility transistor.

* * * * *